US012293996B2

(12) United States Patent
Yi et al.

(10) Patent No.: US 12,293,996 B2
(45) Date of Patent: May 6, 2025

(54) SEMICONDUCTOR PACKAGE INCLUDING HEAT DISSIPATION STRUCTURE

(71) Applicant: SAMSUNG ELECTRO-MECHANICS CO., LTD., Suwon-si (KR)

(72) Inventors: Moon Hee Yi, Suwon-si (KR); Seung Eun Lee, Suwon-si (KR); Yong Hoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 442 days.

(21) Appl. No.: 17/710,512

(22) Filed: Mar. 31, 2022

(65) Prior Publication Data

US 2023/0170339 A1 Jun. 1, 2023

(30) Foreign Application Priority Data

Nov. 30, 2021 (KR) ........................ 10-2021-0168597

(51) Int. Cl.
*H01L 25/10* (2006.01)
*H01L 23/367* (2006.01)
(Continued)

(52) U.S. Cl.
CPC ........ *H01L 25/105* (2013.01); *H01L 23/3675* (2013.01); *H01L 23/481* (2013.01);
(Continued)

(58) Field of Classification Search
CPC ... H01L 25/105; H01L 25/0657; H01L 25/18; H01L 25/11; H01L 23/3675; H01L 23/481; H01L 23/13; H01L 23/49816; H01L 23/49833; H01L 23/3677; H01L 23/3128; H01L 23/3672; H01L 24/16; H01L 24/32;
(Continued)

(56) References Cited

U.S. PATENT DOCUMENTS 9,305,855 B2 * 4/2016 Kim ................... H01L 23/3121
9,502,342 B2 * 11/2016 Kim ..................... H01L 21/565
(Continued)

FOREIGN PATENT DOCUMENTS

KR 10-2015-0049164 A 5/2015
KR 10-2019-0042975 A 4/2019
KR 10-2021-0109258 A 9/2021

*Primary Examiner* — Ida M Soward
(74) *Attorney, Agent, or Firm* — Morgan, Lewis & Bockius LLP

(57) ABSTRACT

A semiconductor package includes a first substrate, a first electronic component disposed on the first substrate, a second substrate disposed on the first substrate and provided with a cavity disposed in one surface of the second substrate, a first connection member connecting the first and second substrates to each other, a heat dissipation structure disposed on the second substrate and spaced apart from the first connection member, a second connection member disposed on the second substrate, and a via disposed on the second substrate, spaced apart from the heat dissipation structure, and connected to the first connection member. The second substrate includes a first region in which the cavity is disposed and a second region connected to the first substrate, and the heat dissipation structure is disposed in each of the first and second regions of the second substrate.

19 Claims, 6 Drawing Sheets

(51) Int. Cl.
*H01L 23/48* (2006.01)
*H01L 23/00* (2006.01)

(52) U.S. Cl.
CPC .............. *H01L 24/16* (2013.01); *H01L 24/32* (2013.01); *H01L 24/48* (2013.01); *H01L 24/73* (2013.01); *H01L 2224/16225* (2013.01); *H01L 2224/32225* (2013.01); *H01L 2224/48225* (2013.01); *H01L 2224/73204* (2013.01); *H01L 2225/1023* (2013.01); *H01L 2225/1041* (2013.01); *H01L 2225/1058* (2013.01); *H01L 2225/1094* (2013.01); *H01L 2924/1815* (2013.01); *H01L 2924/182* (2013.01)

(58) Field of Classification Search
CPC ......... H01L 24/48; H01L 24/73; H01L 24/81; H01L 2224/16225; H01L 2224/32225; H01L 2224/48225; H01L 2224/73204; H01L 2225/1023; H01L 2225/1041; H01L 2225/1058; H01L 2225/1094; H01L 2225/1088; H01L 2924/1815; H01L 2924/182
See application file for complete search history.

(56) References Cited

U.S. PATENT DOCUMENTS

| | | | |
|---|---|---|---|
| 10,622,340 B2* | 4/2020 | Jeong | H01L 23/3135 |
| 11,121,079 B2* | 9/2021 | Cho | H01L 23/36 |
| 11,282,763 B2* | 3/2022 | Kim | H01L 23/3128 |
| 11,502,032 B2* | 11/2022 | Chen | H01L 21/6835 |
| 2014/0339708 A1* | 11/2014 | Jang | H01L 23/3128 257/782 |
| 2015/0054148 A1* | 2/2015 | Jang | H01L 25/105 257/713 |
| 2015/0115466 A1* | 4/2015 | Kim | H01L 23/3121 257/774 |
| 2016/0020195 A1* | 1/2016 | Chiang | H01L 25/50 438/109 |
| 2016/0133613 A1* | 5/2016 | Seo | H01L 23/36 257/686 |
| 2018/0350747 A1* | 12/2018 | Hwang | H01L 23/5389 |
| 2019/0096791 A1* | 3/2019 | Jeng | H01L 21/56 |
| 2019/0115325 A1 | 4/2019 | Im et al. | |
| 2019/0237382 A1* | 8/2019 | Kim | H01L 24/92 |
| 2020/0043854 A1* | 2/2020 | Oh | H01L 24/16 |
| 2020/0144192 A1* | 5/2020 | Choi | H01L 23/13 |
| 2020/0144237 A1* | 5/2020 | Kang | H10N 10/817 |
| 2021/0233826 A1* | 7/2021 | Park | H01L 23/3735 |
| 2021/0272880 A1* | 9/2021 | Lee | H01L 23/3128 |
| 2022/0173082 A1* | 6/2022 | Kim | H01L 23/5389 |

* cited by examiner

SEMICONDUCTOR PACKAGE INCLUDING HEAT DISSIPATION STRUCTURE

CROSS-REFERENCE TO RELATED APPLICATION

This application claims the benefit under 35 USC 119 (a) of Korean Patent Application No. 10-2021-0168597 filed on Nov. 30, 2021 in the Korean Intellectual Property Office, the entire disclosure of which is incorporated herein by reference for all purposes.

TECHNICAL FIELD

The present disclosure relates to a semiconductor package.

BACKGROUND

In order to respond to the recent trend for weight reductions and miniaturization of mobile devices, the need to implement lightweightedness, thinning, and compactness has also been increasing in semiconductor packages mounted therein.

On the other hand, as mobile devices are becoming lighter, thinner and smaller, in response to such technical demands, a technology in which electronic components such as ICs, active devices or passive devices are inserted into the board is required in terms of shortening the connection path between electronic components and reducing noise. In recent years, research into a technology for embedding components in a substrate in various manners has continued.

In detail, as the thickness of the semiconductor package is reduced, a method for effectively dissipating heat generated by the semiconductor chip is continuously being discussed.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a semiconductor package including a microcircuit and/or a micro via.

An aspect of the present disclosure is to provide a semiconductor package in which heat generated by a semiconductor chip may be effectively dissipated.

According to an aspect of the present disclosure, a semiconductor package includes a first substrate on which a first electronic component is disposed on one surface; a second substrate disposed on the first substrate and provided with a cavity disposed in one surface; and a via penetrating through the second substrate. The second substrate includes a first region in which the cavity is disposed, and a second region connected to the first substrate. The via is disposed in each of the first and second regions of the second substrate.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
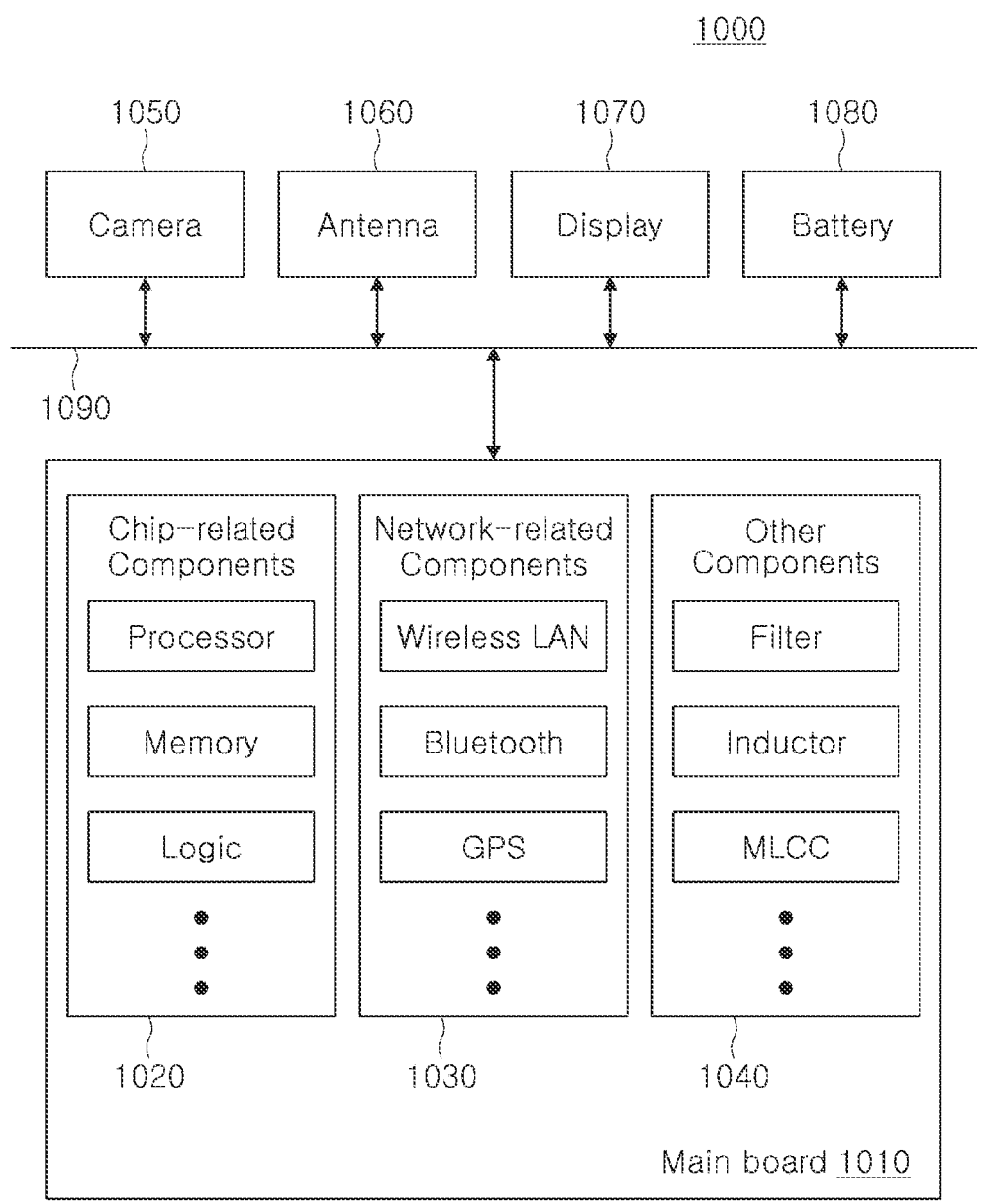
FIG. 1 is a diagram schematically illustrating an example of an electronic device system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an embodiment or example, e.g., as to what an embodiment or example may include or implement, means that at least one embodiment or example exists in which such a feature is included or implemented while all examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other manners (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape occurring during manufacturing.

The features of the examples described herein may be combined in various manners as will be apparent after gaining an understanding of the disclosure of this application. Further, although the examples described herein have a variety of configurations, other configurations are possible as will be apparent after gaining an understanding of the disclosure of this application.

The drawings may not be to scale, and the relative sizes, proportions, and depiction of elements in the drawings may be exaggerated for clarity, illustration, and convenience.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to other electronic components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other. The chip-related component 1020 may be in the form of a package including the above-described chip or electronic component.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other electronic components that may or may not be physically or electrically connected to the mainboard 1010. These other electronic components may include, for example, a camera module 1050, an antenna module 1060, a display device 1070, a battery 1080, and the like, but are not limited thereto. For example, other electronic components may also include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. In addition, these other components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device used for processing data.

Figure 2:
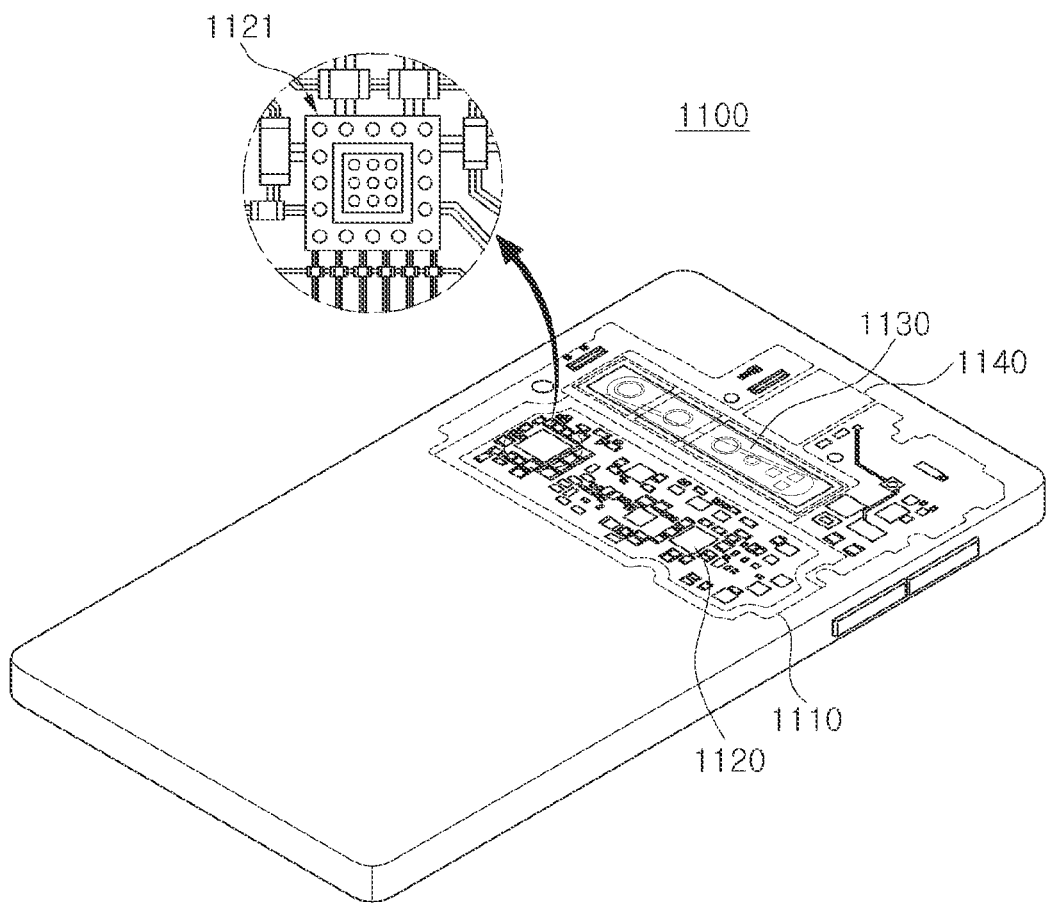
FIG. 2 is a diagram schematically illustrating an example of an electronic device.

FIG. 2 is a schematic perspective view illustrating an example of an electronic device.

Referring to FIG. 2, the electronic device may be, for example, a smartphone 1100. A main board 1110 is accommodated in the smartphone 1100, and various electronic components 1120 are physically and/or electrically connected to the mainboard 1110. In addition, other electronic components that may or may not be physically or electrically connected to the motherboard 1110, such as a camera module 1130 and/or a speaker 1140, may be accommodated in the electronic device. Some of the electronic components 1120 may be the chip related components described above, for example, an antenna module 1121, but are not limited thereto. The antenna module 1121 may be in the form in which electronic components are surface mounted on a semiconductor package, but the present disclosure is not limited thereto. On the other hand, the electronic device is not necessarily limited to the smartphone 1100, and may also be another electronic device as described above.

Semiconductor Package

Figure 3:
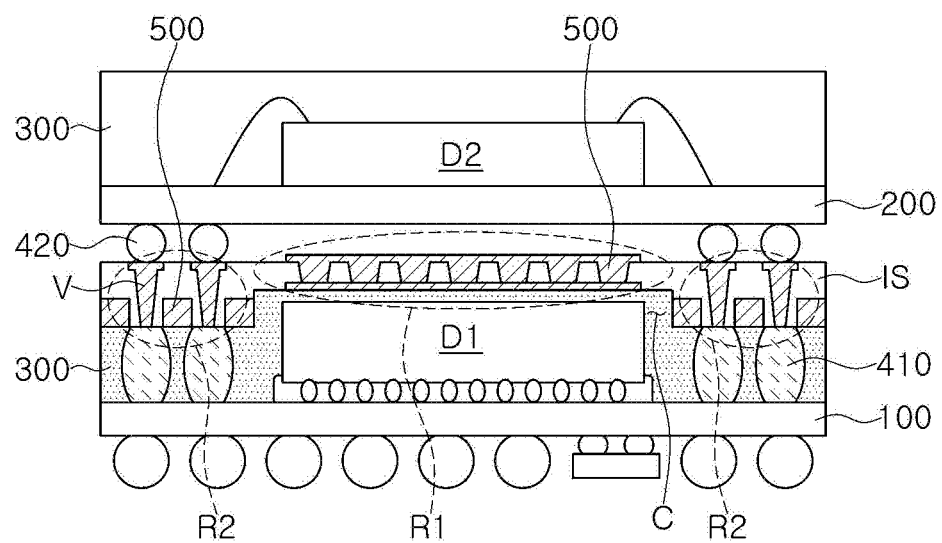
FIG. 3 is a diagram schematically illustrating an example of a semiconductor package according to an embodiment.

FIG. 3 is a diagram schematically illustrating an example of a semiconductor package 10A according to an embodiment.

Referring to FIG. 3, the semiconductor package 10A according to an embodiment may include a first substrate 100 having a first electronic component D1 disposed on one surface, a second substrate IS disposed on the first substrate 100 and having a cavity C formed in one surface, and a heat dissipation structure 500 penetrating through the second substrate IS. At least a portion of the heat dissipation structure 500 may be disposed in the second substrate IS. In this case, the first substrate 100 and the second substrate IS may be connected to each other by first connection members 410 including metals such as solders. In addition, the semiconductor package 10A according to an embodiment may include second connection members 420 including metals such as solders disposed on the second substrate IS, and a via V disposed in the second substrate IS, insulated from the heat dissipation structure 500 and connected to the first solder 410.

In addition, the second substrate IS may include a first region R1 in which the cavity C is formed, and a second region R2 connected to the first substrate 100, and the heat dissipation structure 500 may be disposed in each of the first and second regions R1 and R2 of the second substrate IS. For example, the heat dissipation structure 500 penetrating through the second substrate IS may include the region in which the cavity C is formed and be formed to extend to the periphery thereof. In this case, it can be seen that the heat dissipation structure 500 and the via V disposed in the second substrate IS are insulated from each other, such that the heat dissipation structure 500 has a structure and function different from the via V connecting the signal patterns.

The heat dissipation structure 500 penetrating in or penetrating through the second substrate IS may function as a heat dissipation via emitting heat generated by the electronic component, and the heat dissipation effect may further be improved by widening the region in which the heat dissipation structure 500 is formed around the first electronic component D1 as described above. In one example, the heat dissipation structure 500 may be disposed above or overlap with the first electronic component D1, when viewed in a stacking direction of the first and second substrates 100 and IS.

The first electronic component D1 of the semiconductor package 10A according to an embodiment may be disposed in the cavity C of the second substrate IS, and the type of the first electronic component D1 may correspond to a passive electronic component, an active electronic component, a semiconductor die, a chip electronic component, or the like, but is not limited thereto. For example, the first electronic component D1 may indicate a known component as long as it is a type of electronic component that may be mounted on a printed circuit board.

In addition, the semiconductor package 10A according to an embodiment may further include a molding material disposed inside the cavity C of the second substrate IS and sealing the first electronic component D1, and a third substrate 200 connected to the second substrate IS. In this case, a second electronic component D2 may be disposed on one surface of the third substrate 200.

The type of the second electronic component D2 may correspond to a passive electronic component, an active electronic component, a semiconductor die, a chip electronic component, or the like, but is not limited thereto. For example, the second electronic component D2 may refer to a known component as long as it is a type of electronic component that may be mounted on a printed circuit board.

The first to third substrates 100, IS and 200 of the semiconductor package 10A according to an embodiment may each include at least one insulating layer, a circuit layer, and a via. In this case, the insulating layer may include a known insulating material, but the material thereof is not limited thereto. In more detail, as the material of the insulating layer, a thermosetting resin such as an epoxy resin, a thermoplastic resin such as polyimide, or a resin in which these resins are impregnated into a core material such as glass fiber (Glass Cloth, Glass Fabric) together with an inorganic filler, for example, at least one of prepreg, Ajinomoto Build-up Film (ABF), FR-4, or Bismaleimide Triazine (BT) may be used.

In addition, as a material of each of the circuit layer, the heat dissipation structure 500 and the via (V), a conductive material such as copper (Cu), aluminum (Al), silver (Ag), tin (Sn), gold (Au), nickel (Ni), lead (Pb), titanium (Ti), palladium (Pd), or alloys thereof may be used, but is not limited thereto. In this case, the via V may correspond to a via penetrating through at least a portion of the insulating layer of each of the first to third substrates 100, IS, and 200.

In addition, the circuit layer, the heat dissipation structure 500 and the via V of the semiconductor package 10A according to an embodiment may be respectively formed by a plating process, and in this case, an electroless plating layer and an electrolytic plating layer may be included. The electroless plating layer may serve as a seed layer for the electrolytic plating layer, but the present disclosure is not limited thereto.

In this case, the electroless plating layer and the electrolytic plating layer filling the circuit layer, the heat dissipation structure 500 and the via (V) may also include copper (Cu), aluminum (Al), silver (Ag), tin (Sn), gold (Au), nickel (Ni), lead (Pb), titanium (Ti), palladium (Pd), or alloys thereof.

At least a portion of the circuit layer formed on one surface of the insulating layer disposed on an outermost layer of the semiconductor package 10A according to an embodiment may include a surface treatment layer, and the surface treatment layer may include a composition different from each of the circuit layers. For example, each of the circuit layers may include copper (Cu), and the surface treatment layer may include nickel (Ni) or tin (Sn), but the configuration is not limited thereto.

In addition, in the semiconductor package 10A according to an embodiment, a solder resist layer may further be disposed to cover at least a portion of the circuit layer including the surface treatment layer formed on the outermost layer. In this case, the solder resist layer may be formed of a photosensitive material. In addition, the solder resist may have thermosetting and/or photocuring properties, but the present disclosure is not limited thereto.

Also, the first solder 410 connecting the first substrate 100 and the second substrate IS of the semiconductor package 10A according to an embodiment may correspond to a known solder bump. For example, the first solder may include, but is not limited to, copper (Cu), nickel (Ni), gold (Au), indium (In), bismuth (Bi), or other non-reactive metals.

The first and second electronic components D1 and D2 disposed on the first and third substrates 100 and 200, respectively, may be embedded by the molding material 300, respectively. In this case, the molding material 300 may include a known material, for example, may include an epoxy molding compound (EMC), but the present disclosure is not limited thereto.

Figure 4A:
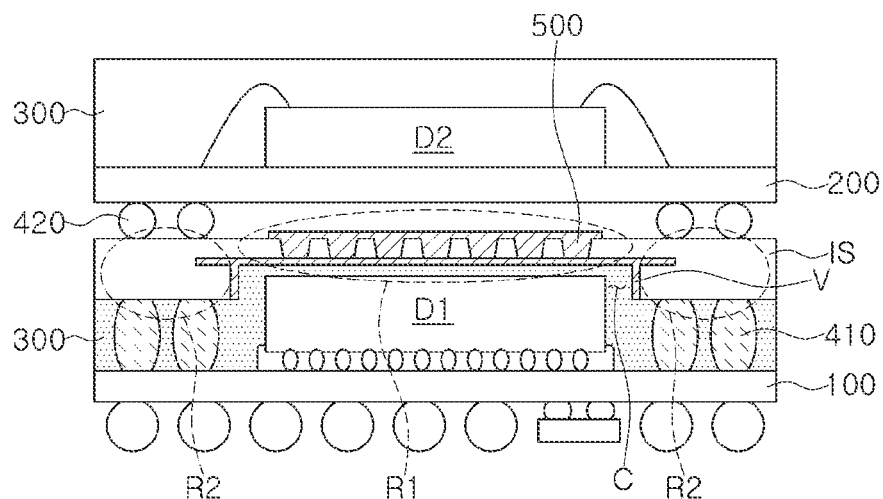
FIGS. 4A and 4B are diagrams schematically illustrating examples of semiconductor packages according to embodiments.
Figure 4B:
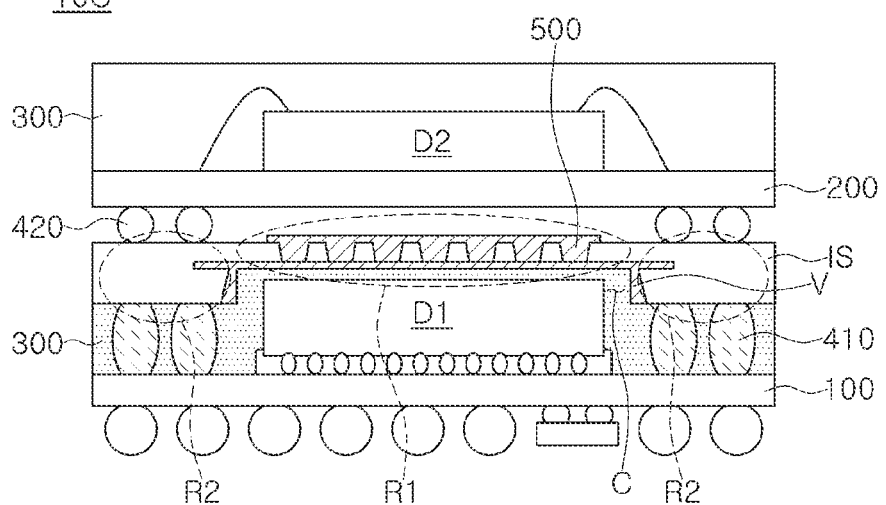

FIGS. 4A and 4B are diagrams schematically illustrating examples of semiconductor packages 10B and 10C according to embodiments.

Referring to the drawings, in the semiconductor package 10B according to an embodiment, at least a portion of vias disposed in a second region R2 of the heat dissipation structure 500 penetrating through the second substrate IS may be exposed to a sidewall of the cavity C of the second substrate IS. For example, the via disposed in the second region R2 of the second substrate IS may be disposed on the sidewall of the cavity C of the second substrate IS, but the configuration is not limited thereto. In addition, the circuit layer is extended in a lateral direction, on the lower surface of the heat dissipation structure 500, and may be used as a heat transfer path, thereby improving the heat dissipation function.

As described above, since the heat dissipation structure 500 having a heat dissipation function is exposed by the sidewall of the cavity C, heat generated by the first electronic component D1 is more effectively transferred to externally, and thus, the heat dissipation function of the semiconductor package 10B may be improved.

Also, referring to FIG. 4B, in the semiconductor package 10C according to an embodiment, at least a portion of the vias disposed in the second region R2 of the heat dissipation structure 500 penetrating through the second substrate IS may be exposed through a sidewall of the cavity C of the second substrate IS. In this case, the heat dissipation structure 500 disposed on the sidewall of the cavity C may have a shape that is tapered in the direction of the third substrate 200 to be described later. For example, the cross-section or the dimension of the heat dissipation structure 500 exposed through the sidewall of the cavity may be maximum in the region closest to the first substrate 100. This corresponds to a structure obtained by performing a process such as a laser drill, a CNC drill, or a blasting method such that the sidewall penetrates the heat dissipation structure 500 in the process of forming the cavity C in the second substrate IS. Alternatively, the cavity C may also be formed by plating and etching methods, but the formation method is not limited thereto.

In addition, the circuit layer is extended in the lateral direction on the lower surface of the heat dissipation structure 500, to be used as a heat transfer path, thereby improving the heat dissipation function.

As described above, since the heat dissipation structure 500 having a heat dissipation function is exposed by the sidewall of the cavity C, heat generated by the first electronic component D1 is more effectively transferred externally, and thus, the heat dissipation function of the semiconductor package 10B may be improved.

Descriptions of other components are substantially the same as those described above, and detailed descriptions thereof will be omitted.

Figure 5:
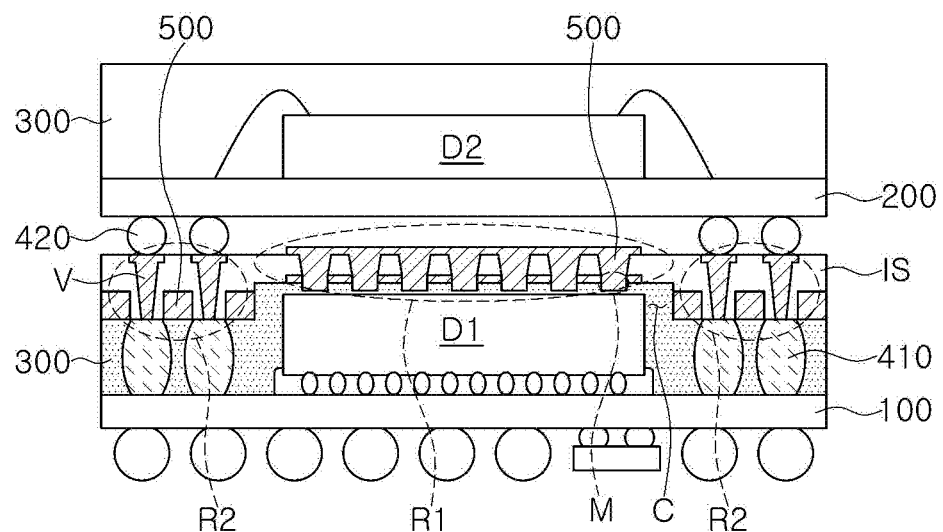
FIG. 5 is a diagram schematically illustrating an example of a semiconductor package according to an embodiment.

FIG. 5 is a diagram schematically illustrating an example of a semiconductor package 10D according to an embodiment.

Referring to the drawings, in the semiconductor package 10D according to an embodiment, a molding material 300 in which a first electronic component D1 is embedded may be included, and in this case, a heat dissipation structure 500 disposed on the second substrate IS may include a metal portion M that penetrates through a portion of the molding material 300 and is spaced apart from the first electronic component D1.

For example, the heat dissipation structure 500 penetrating through the upper and lower surfaces of the second substrate IS may include the metal portion M protruding from the bottom surface of the cavity C, and the distance between the electronic component D1 and the heat dissipation structure 500 having a heat dissipation function may be reduced by the metal portion M, and accordingly, heat may be more effectively dissipated to the outside thereof.

However, the first electronic component D1 and the metal portion M do not come into contact, and may have a space of about 20 to 30 μm formed therebetween, but the configuration is not limited thereto.

Descriptions of other components are substantially the same as those described above, and detailed descriptions thereof will be omitted.

Figure 6A:
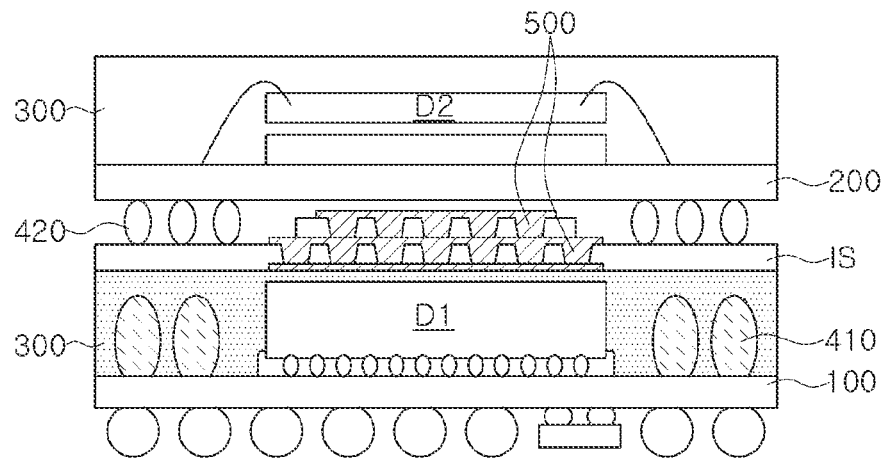
FIGS. 6A and 6B are diagrams schematically illustrating examples of semiconductor packages according to embodiments.
Figure 6B:
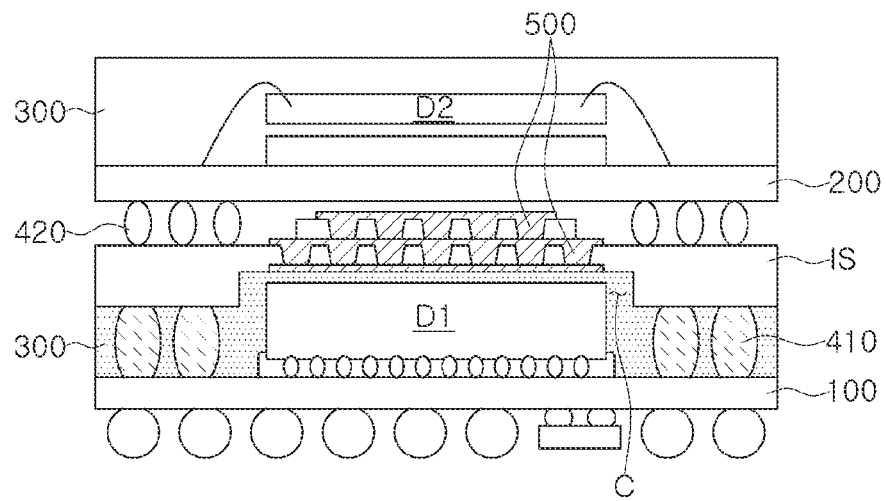

FIGS. 6A and 6B are diagrams schematically illustrating examples of semiconductor packages 10E and 10F according to an embodiment.

Referring to the drawings, the semiconductor package 10E according to an embodiment may include a first substrate 100 having a first electronic component D1 disposed on one surface, a second substrate IS disposed on the first substrate 100, and a heat dissipation structure 500 penetrating through the upper and lower surfaces of the second substrate IS. In this case, a first solder 410 connecting the first substrate 100 and the second substrate IS may be further included. In this case, a step may be formed on one surface of the second substrate IS, and the heat dissipation structure 500 may be disposed as a plurality of metal layers in the region in which the step is formed.

In detail, the semiconductor package 10E according to the embodiment may further include a third substrate 200 on which a second electronic component D2 is disposed on one surface, and a second solder 420 connecting the third substrate 200 and the second substrate IS. In this case, the second solder 420 may be spaced apart from the region in which the step of the second substrate IS is formed. For example, the second substrate IS may include a region in which the second solder 420 connected to the third substrate 200 is disposed, and a region in which the step is formed. In this case, the region in which the step is formed may have a height higher than that of the region in which the second solder 420 is disposed. For example, the insulating layer and the circuit layer may be disposed in the region of the second substrate IS in which the step is formed, such that the region of the second substrate IS in which the step is formed may be closer to the third substrate 200 than the outside region, for example, the region in which the second solder 420 is disposed.

The heat dissipation structure 500 may be disposed in a plurality of layers in the region formed to be higher than the peripheral portion. The heat dissipation structure 500 penetrating through the second substrate IS may function to radiate heat generated by the electronic component, and as described above, a portion of formation of the heat dissipation structure 500 adjacent to the region in which the first electronic component D1 is disposed may be expanded, thereby further improving the heat dissipation effect.

The type of the first electronic component D1 of the semiconductor package 10E according to an embodiment may correspond to a passive electronic component, an active electronic component, a semiconductor die, a chip electronic component, or the like, but is not limited thereto. For example, the first electronic component D1 may indicate a known component as long as it is a type of electronic component that may be mounted on a printed circuit board.

In addition, in the semiconductor package 10E according to an embodiment, the second electronic component D2 may be disposed on one surface of the third substrate 200. The type of the second electronic component D2 may correspond to a passive electronic component, an active electronic component, a semiconductor die, a chip electronic component, or the like, but is not limited thereto. For example, the second electronic component D2 may indicate a known component as long as it is a type of electronic component that may be mounted on a printed circuit board.

The first to third substrates 100, IS and 200 of the semiconductor package 10E according to an embodiment may each include at least one insulating layer, a circuit layer, and a via. In this case, the insulating layer may include a known insulating material, but the material is not limited thereto. In detail, as the material of the insulating layer, a thermosetting resin such as an epoxy resin, a thermoplastic resin such as polyimide, or a resin in which these resins are impregnated in a core material such as glass fiber (Glass Cloth, Glass Fabric) together with an inorganic filler, for example, at least one of prepreg, Ajinomoto Build-up Film (ABF), FR-4, and Bismaleimide Triazine (BT) may be used.

In addition, as the material of each of the circuit layer, the heat dissipation structure 500 and the via V, a conductive material such as copper (Cu), aluminum (Al), silver (Ag), tin (Sn), gold (Au), nickel (Ni), lead (Pb), titanium (Ti), palladium (Pd), or alloys thereof may be used, but is not limited thereto. In this case, the via V may correspond to a via penetrating through at least a portion of the insulating layer of each of the first to third substrates 100, IS and 200.

In addition, each of the circuit layer, the heat dissipation structure 500 and the via V of the semiconductor package 10E according to an embodiment may be formed by a plating process, and in this case, an electroless plating layer and an electrolytic plating layer may be included. The electroless plating layer may serve as a seed layer for the electrolytic plating layer, but the configuration is not limited thereto.

In this case, the electroless plating layer and the electrolytic plating layer filling the circuit layer, the heat dissipation structure 500 and the via V may also include copper (Cu), aluminum (Al), silver (Ag), tin (Sn), gold (Au), nickel (Ni), lead (Pb), titanium (Ti), palladium (Pd), or alloys thereof.

At least a portion of the circuit layer formed on one surface of the insulating layer disposed on an outermost layer of the semiconductor package 10E according to an embodiment may include a surface treatment layer, and the surface treatment layer may include a composition different from each of the circuit layers. For example, each of the circuit layers may include copper (Cu), and the surface treatment layer may include nickel (Ni) or tin (Sn), but the present disclosure is not limited thereto.

In addition, in the semiconductor package 10E according to an embodiment, a solder resist layer covering at least a portion of the circuit layer including the surface treatment layer formed on the outermost layer may be further disposed. In this case, the solder resist layer may be formed of a photosensitive material. In addition, the solder resist may have thermosetting and/or photocuring properties, but the present disclosure is not limited thereto.

Also, the first solder 410 connecting the first substrate 100 and the second substrate IS of the semiconductor package 10E according to an embodiment may correspond to a known solder bump, and for example, may include, but is not limited to, copper (Cu), nickel (Ni), gold (Au), indium (In), bismuth (Bi), or other non-reactive metals.

The first and second electronic components D1 and D2 disposed on the first and third substrates 100 and 200, respectively, may be respectively embedded by a molding material 300. In this case, the molding material 300 may include a known material, for example, may include an epoxy molding compound (EMC), but the present disclosure is not limited thereto.

Also, referring to FIG. 6B, in the semiconductor package 10F according to an embodiment, a cavity C may be formed in the second substrate IS. In this case, the cavity C may be formed by a known method, and for example, may correspond to a structure obtained by performing a process such as a laser drill, a CNC drill, or a blasting method. Alternatively, the cavity C may also be formed by plating and etching methods, but the formation method is not limited thereto.

The first electronic component D1 of the semiconductor package 10F according to an embodiment may be disposed in the cavity C of the second substrate IS, and the first electronic component D1 may refer to a known component as long as it is a type of electronic component that may be mounted on a printed circuit board.

In addition, the semiconductor package 10F according to an embodiment may further include a molding material 300 disposed inside the cavity C of the second substrate IS and embedding the first electronic component D1, and a third substrate 200 connected to the second substrate IS. In this case, the second electronic component D2 may be disposed on one surface of the third substrate 200.

Descriptions of other components are substantially the same as those described above, and detailed descriptions thereof will be omitted.

The insulating layer of the semiconductor package 10B according to an embodiment may include a composition of a known build-up insulating layer. In detail, a thermosetting resin such as an epoxy resin, a thermoplastic resin such as polyimide, or a resin in which these resins are impregnated into a core material such as glass fiber (Glass Cloth, Glass Fabric) together with an inorganic filler, for example, at least one of a prepreg, Ajinomoto Build-up Film (ABF), FR-4, or Bismaleimide Triazine (BT) may be used.

Descriptions of other components are substantially the same as those described above, and detailed descriptions thereof will be omitted.

As set forth above, according to an embodiment, a semiconductor package including a microcircuit and/or a micro via may be provided.

According to an embodiment, a semiconductor package in which heat generated by a semiconductor chip may be effectively dissipated may be provided.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor package comprising:
   a first substrate;
   a first electronic component disposed on the first substrate;
   a second substrate disposed on the first substrate and provided with a cavity disposed in one surface of the second substrate;
   a first connection member connecting the first and second substrates to each other;
   a heat dissipation structure disposed on the second substrate and spaced apart from the first connection member;
   a second connection member disposed on the second substrate; and
   a conductive via disposed in the second substrate, spaced apart from the heat dissipation structure, and electrically connecting the second connection member to the first connection member,
   wherein the second substrate includes a first region in which the cavity is disposed and a second region connected to the first substrate, and
   the heat dissipation structure is disposed in each of the first and second regions of the second substrate.

2. The semiconductor package of claim 1, wherein at least a portion of the first electronic component is disposed in the cavity of the second substrate.

3. The semiconductor package of claim 1, wherein a portion of the heat dissipation structure disposed in the second region of the second substrate is disposed on a sidewall of the cavity of the second substrate.

4. The semiconductor package of claim 3, wherein the heat dissipation structure disposed on the sidewall of the cavity of the second substrate has a maximum cross-section in a region adjacent to the first substrate.

5. The semiconductor package of claim 1, further comprising a molding material disposed inside the cavity of the second substrate and sealing the first electronic component.

6. The semiconductor package of claim 1, wherein the heat dissipation structure disposed in the first region of the second substrate comprises a metal portion penetrating through a portion of the molding material and spaced apart from the first electronic component.

7. The semiconductor package of claim 1, further comprising a third substrate connected to the second connection member disposed on the second substrate.

8. The semiconductor package of claim 1, wherein each of the first and second connection members includes a solder.

9. The semiconductor package of claim 1, wherein the heat dissipation structure is insulated from the via and the first connection member.

10. The semiconductor package of claim 1, wherein the via is disposed in the second region and penetrates through an opening of the heat dissipation structure in the second region.

11. The semiconductor package of claim 1, wherein one surface of the second substrate is provided with a step, and the heat dissipation structure includes a plurality of metal layers in a region in which the step is disposed.

12. A semiconductor package comprising:
    a first substrate provided with a first electronic component disposed on one surface;
    a second substrate disposed on the first substrate; and
    a heat dissipation structure disposed on the second substrate,
    wherein one surface of the second substrate is provided with a step, and
    the heat dissipation structure includes a plurality of metal layers in a region in which the step is disposed.

13. The semiconductor package of claim 12, further comprising a first connection member connecting the first substrate and the second substrate.

14. The semiconductor package of claim 13, wherein the first connection member includes a solder.

15. The semiconductor package of claim 12, further comprising a molding material sealing the first electronic component.

16. The semiconductor package of claim 12, further comprising a third substrate having a second electronic component disposed on the one surface of the second substrate.

17. The semiconductor package of claim 16, further comprising a second connection member connecting the second substrate and the third substrate,
    wherein the second connection member is spaced apart from the region in which the step of the one surface of the second substrate is disposed.

18. The semiconductor package of claim 17, wherein the second connection member includes a solder.

19. The semiconductor package of claim 12, wherein the second substrate includes a cavity,
    wherein at least a portion of the first electronic component is disposed in the cavity of the second substrate.

* * * * *